US007146269B2

(12) United States Patent
Friedrich et al.

(10) Patent No.: US 7,146,269 B2
(45) Date of Patent: Dec. 5, 2006

(54) METHOD FOR DETERMINING DEFECTIVE ACTUATORS IN AN INTERNAL COMBUSTION ENGINE

(75) Inventors: Arno Friedrich, Regensburg (DE); Walter Schrod, Regensburg (DE); Hartmut Wolpert, Zeitlarn (DE)

(73) Assignee: Siemens Aktiengesellschaft, Munich (DE)

( * ) Notice: Subject to any disclaimer, the term of this patent is extended or adjusted under 35 U.S.C. 154(b) by 20 days.

(21) Appl. No.: 11/065,675

(22) Filed: Feb. 24, 2005

(65) Prior Publication Data

US 2005/0199051 A1 Sep. 15, 2005

(30) Foreign Application Priority Data

Mar. 15, 2004 (DE) ..................... 10 2004 012 491

(51) Int. Cl.
*H01L 41/04* (2006.01)
*G06G 7/70* (2006.01)

(52) U.S. Cl. .................................... 701/114; 73/119 A

(58) Field of Classification Search ................ 701/114, 701/110, 102; 73/119 A, 117.3; 123/480
See application file for complete search history.

(56) References Cited

U.S. PATENT DOCUMENTS 4,590,907 A * 5/1986 Tsukamoto et al. ......... 123/357
5,816,220 A 10/1998 Stumpp et al. ........... 73/119 A
6,366,868 B1 4/2002 Freudenberg et al. ......... 72/115
6,619,245 B1 9/2003 Fujiwara et al. ......... 123/90.11

FOREIGN PATENT DOCUMENTS

DE 195 36 109 A1 4/1997
DE 198 45 042 A1 4/2000
DE 102 36 819 A1 2/2004

* cited by examiner

*Primary Examiner*—Hieu T. Vo
(74) *Attorney, Agent, or Firm*—Laurence A. Greenberg; Werner H. Stemer; Ralph E. Locher

(57) ABSTRACT

Defective actuators in an internal combustion engine with at least one cylinder are detected. A mean value, in particular the arithmetic mean value, determines a measurement variable of all the actuators of a given type present on the cylinders. The measurement variable depends on at least one parameter. In a further step, a deviation is formed which is independent of the parameter. This ensures that the deviation across the entire parameter range remains constant. In a further step, the limit values, in particular the upper and lower limit values, are formed, the limit values being dependent on the deviation and on the mean value formed above. If an individual value of the measurement variable exceeds one of the two limit values, the method according to the invention detects this actuator as faulty and/or defective.

13 Claims, 2 Drawing Sheets

METHOD FOR DETERMINING DEFECTIVE ACTUATORS IN AN INTERNAL COMBUSTION ENGINE

BACKGROUND OF THE INVENTION

Field of the Invention

The invention relates to a method for determining defective actuators in an internal combustion engine, in particular actuators in self-igniting internal combustion engines.

In a common rail injection system operating with piezoelectric actuators, or piezo actuators, a diagnostic must be available which detects faulty piezo actuators. Examination of the piezo capacitance has become generally accepted for this purpose. Known diagnostics determine a fixed upper and lower capacitance threshold in the diagnostics routine. The piezo actuator is recognized by the diagnostic routine as defective if the threshold values and/or limit values are exceeded or undershot. Nevertheless, the value of the capacitance of the piezo is very heavily dependent on the temperature of the component. An internal combustion engine can thus reach operating temperatures of between −30° C. and +400° C. With low temperatures and high temperatures, the piezo actuators can for example have a capacitance of 1.5 μF and 6 μF respectively. Therefore it is not sufficient merely to define an individual limit value for the upper and/or lower capacitance in order to reliably determine a defective actuator in all operating temperatures. Prior art diagnostic routines define constant limit values for a specific temperature range in each instance. In other words, the limit value, be it either upper or lower, resembles a step function.

This prior art method is particularly disadvantageous since the selection of the distance to the upper and lower limit values must be sizeable despite the adaptation. Defective piezo actuators are thus detected at a very late stage. Furthermore, this type of known diagnostic method does not permit the reliable detection of ageing effects of piezos.

SUMMARY OF THE INVENTION

It is accordingly an object of the invention to provide a method for determining defective actuators in an internal combustion engine which overcomes the above-mentioned disadvantages of the heretofore-known devices and methods of this general type and which method is particularly reliable in detecting ageing effects appearing in actuators at an early stage.

With the foregoing and other objects in view there is provided, in accordance with the invention, a method for determining defective actuators in an internal combustion engine with at least one cylinder, where each cylinder has at least one actuator, the method which comprises:

forming a mean value of a measurement variable of all actuators of a given type in all cylinders in dependence of at least one parameter;

forming a deviation dependent on the parameter;

forming lower and upper limit values dependent on the deviation and on the mean value; and classifying an actuator as defective if one of the limit values or is exceeded by an individual value of the measurement variable of the actuator.

The term "exceed" as used here includes the concepts of overshoot and undershoot, i.e., it refers to the measured parameter leaving the band defined between the upper and lower limit thresholds.

In other words, in accordance with the invention, the method for detecting defective actuators in an internal combustion engine having at least one cylinder forms the mean value, in particular the arithmetic mean value, of a measurement variable of all actuators of one type present on the cylinders. This measurement variable depends on at least one parameter. Each cylinder has at least one actuator. A cylinder can thus have several injectors operating with piezo and/or magnetic actuators, but similarly inlet and outlet valves operating with magnetic actuators. In a further step, the method forms a deviation which is independent of the parameter. This ensures that the deviation remains constant across the entire parameter range. In a further step, the limit values, in particular the upper and lower limit values, are formed, said values being dependent on the deviation and on the mean value established above. If an individual value of the measurement variable exceeds one of the two limit values, the method according to the invention detects this actuator as defective and/or faulty.

This type of method according to the invention detects a defective actuator earlier and more accurately than a method according to the prior art. In this way it is possible replace an actuator ahead of time, when it goes into the shop for its periodic service for example, before the vehicle breaks down. Furthermore, the method according to the invention can be implemented during vehicle operation, if the exhaust gas limit values deteriorate for example.

An advantageous embodiment of the invention is that the deviation is dependent on the number of actuators of one type present. As already mentioned above, a cylinder can have several actuators of different types. A cylinder can thus have valves which are operated using magnetic actuators, and magnetic actuators for injecting the combustion fuel. These differ in terms of their purpose and their type. The deviation should therefore depend only on an actuator of one type and purpose.

The lower limit and the upper limit can be defined below as a further advantageous invention:

The limit value is equal to the mean value of the measurement variable plus or minus the deviation. The mean value of the measurement variable is formed by dividing the total of all individual values by the number of actuators of one type present (arithmetic mean value). In this way, a band of equal width is defined across the entire parameter range. All the individual values found in this band which are generated by the individual actuators do not impinge upon the above condition, thus said method detects the actuators as serviceable. If for example the measurement variable is the capacitance of a piezo actuator, these capacitances are continuously measured and the mean value is formed from the values of all the actuators. This mean value changes based on the temperature dependency of the capacitance and is suitable as a target value for the current capacitance. This is particularly advantageous if the piezo temperature is not directly measured.

A further advantageous embodiment of the invention is to bring the time and/or actuator temperature into play as parameters. This thus enables the mean value of the measurement variable to be stored across the entire parameter range if the individual values remain within the permitted limit value band. This mean value which is judged to be good is formed at regular time intervals and stored. Once an individual value exceeds the limit values, the mean value stored last is brought into play. This is advantageous in that the stored mean value is not dependent on a faulty actuator. Nevertheless account is still taken of the temporal change caused by signs of ageing.

A further embodiment of the invention is to define the upper and lower limits more narrowly than the above-mentioned limits using this type of saved or stored mean value. This allows defective actuators to be detected at a very early stage.

The method according to the invention is not restricted to piezo actuators but can also be applied to magnetic actuators.

Once more in summary, the defective actuators in an internal combustion engine with at least one cylinder are detected by the method. A mean value, in particular the arithmetic mean value, determines a measurement variable of all the actuators of a given type present on the cylinders. The measurement variable depends on at least one parameter. Each cylinder has at least one actuator. Thus a cylinder can have several injectors operated using piezo and/or magnetic actuators, and similarly inlet and outlet valves operated using magnetic actuators. In a further step, the method forms a deviation which is independent of the parameter. This ensures that the deviation across the entire parameter range remains constant. In a further step, the limit values, in particular the upper and lower limit values, are formed, said limit values being dependent on the deviation and on the mean value formed above. If an individual value of the measurement variable exceeds one of the two limit values, the method according to the invention detects this actuator as faulty and/or defective.

Other features which are considered as characteristic for the invention are set forth in the appended claims.

Although the invention is illustrated and described herein as embodied in a method for determining defective actuators in an internal combustion engine, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
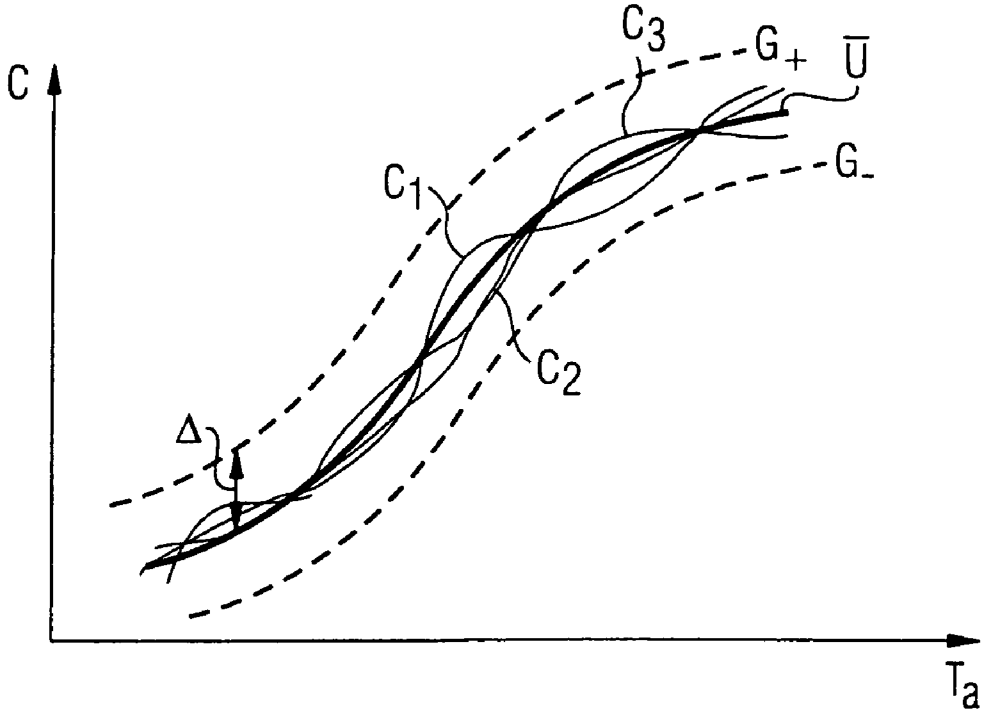
FIG. 1 is a graph showing the temperature dependency of the piezo actuators with the limit values formed according to the invention and the mean value formed according to the invention.
Figure 2:
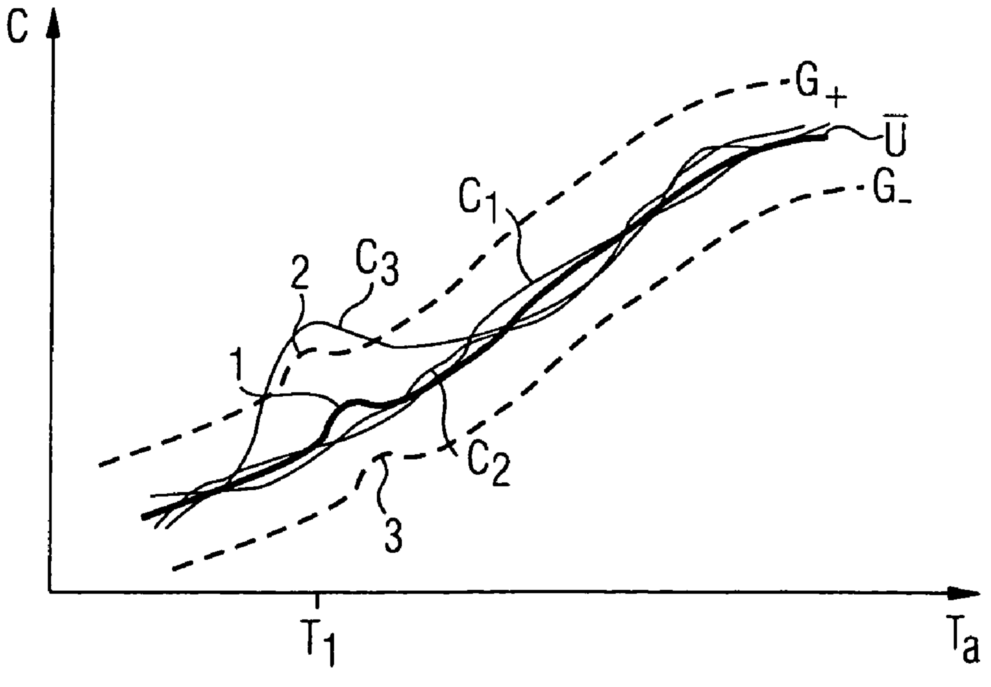
FIG. 2 is a similar graph showing the temperature dependency of the capacitances of the piezo actuators, wherein a curve in a piezo exceeds one of the limits.

Referring now to the figures of the drawing in detail and first, particularly, to FIGS. 1 and 2 thereof, there is illustrated a first exemplary embodiment of the method according to the invention. Both figures show a temperature dependency of the piezo capacitances. In the exemplary embodiment, a piezo capacitance C is brought into play as a measurement variable u. An actuator temperature $T_a$ is used as a parameter p. For greater clarity, only three curves $C_1$ to $C_3$ were plotted. The curve $C_1$ thus shows the temperature dependency of the first piezo actuator. The curve $C_2$ shows the temperature dependency of the capacitance of the second piezo actuator, etcetera.

The arithmetic mean value of these curves $C_1$ to $C_3$ is shown as $\overline{U}$. In this way, the threshold values or limit values $G_+$ and $G_-$ are generated in that the curve $\overline{U}$ is moved higher or lower, respectively, by a deviation Δ. This is shown in FIGS. 1 and 2 by way of a dashed line. All curves $C_1$ to $C_3$ are located within this band defined by the limit values, as seen in FIG. 1.

In contrast to FIG. 1, FIG. 2 shows that the third actuator, which is displayed by means of curve $C_3$ is defective around temperature $T_1$, since the curve $C_3$ exceeds the upper limit $G_+$. The result is that the mean value $\overline{U}$ which is dependent on the individual values $C_1$ to $C_3$ exhibits an upward deflection or blip 1 in the area around temperature $T_1$. This deflection 1 is transferred to the limit value curves $G_+$ and $G_-$ which can be seen in FIG. 2 as deflections 2 and 3.

Figure 3:
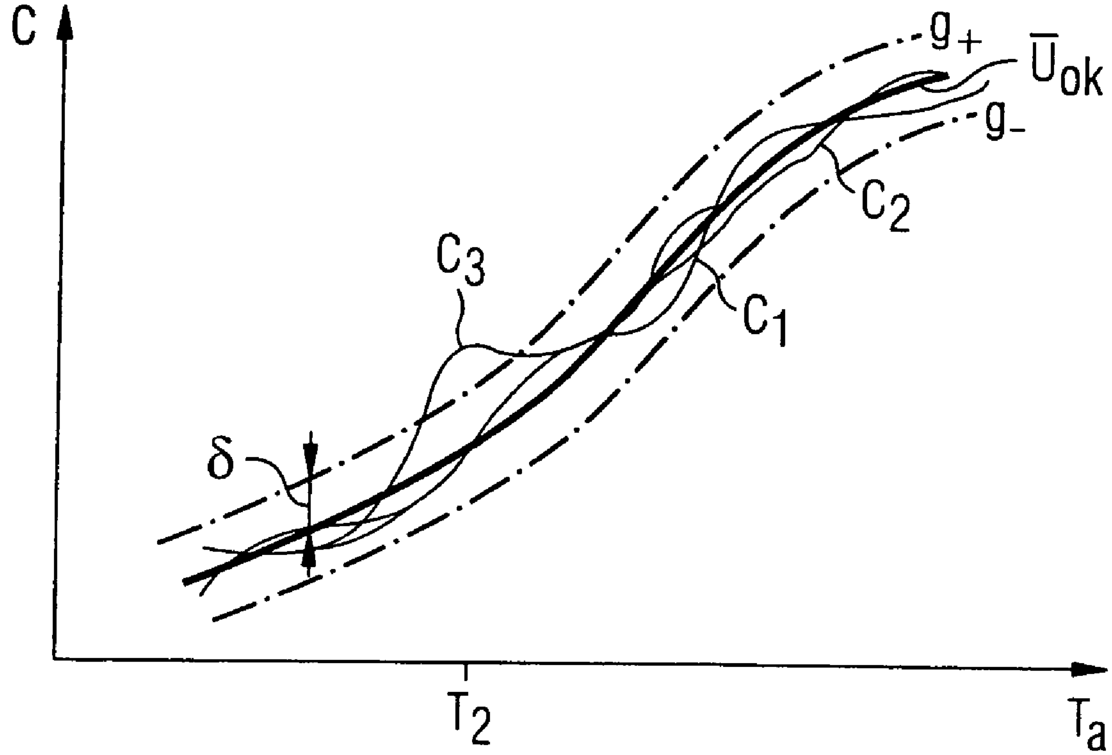
FIG. 3 is a further graph showing the temperature dependencies of the capacitances of the piezo actuators, wherein the mean value is independent of the defective actuator.

The second exemplary embodiment shown in FIG. 3 shows a mean value $\overline{U}_{ok}$, which is independent of the defective piezo actuators. The mean value is formed in exactly the same manner as in FIG. 1. This mean value judged to be good in FIG. 1 is stored as $\overline{U}_{ok}$. If a fault occurs in a piezo actuator at a later stage, a mean value $\overline{U}_{ok}$ stored shortly beforehand is brought into play in order to define new limit values, the limit values being characterized with $g_+$ and $g_-$. In contrast to the limit values in FIG. 1, these new limit values $g_+$ and $g_-$ depend on the stored mean value $\overline{U}_{ok}$ and on a new deviation δ. This new deviation δ is smaller than the deviation Δ.

FIG. 3 shows how the curve $C_3$ of the third piezo actuator exceeds the upper limit value curve $g_+$. Because the limit value is exceeded, this third piezo actuator is detected as defective. It is worth noting that neither the new limit values $g_+$ and $g_-$ nor the stored mean value $\overline{U}_{ok}$ are dependent on the faulty third actuator, which forms curve $C_3$.

In order to detect faulty magnetic actuators, it is conceivable for the inductance of a magnetic actuator to be monitored as a function of the temperature, instead of the capacitance. In addition or alternatively, the electrical resistance of the actuator can further be brought into play as a parameter.

This application claims the priority, under 35 U.S.C. § 119, of German patent application No. 10 2004 012 491.4, filed Mar. 15, 2004; the entire disclosure of the prior application is herewith incorporated by reference.

We claim:

1. A method for determining defective actuators in an internal combustion engine with at least one cylinder, where each cylinder has at least one actuator, the method which comprises:

forming a mean value of a measurement variable of all actuators of a given type in dependence of at least one parameter;

forming a deviation dependent on the parameter;

forming lower and upper limit values dependent on the deviation and on the mean value; and classifying an actuator as defective if one of the limit values or is exceeded by an individual value of the measurement variable of the actuator.

2. The method according to claim 1, wherein the deviation depends on a number of the actuators of the given type present in the engine.

3. The method according to claim 1, which comprises forming the lower limit value as follows:

$$G_-=\overline{U}(p)-\Delta;$$

where $\overline{U}$ is the mean value of the measurement variable U and depends on parameter p, and where Δ represents a value of the deviation.

4. The method according to claim 1, which comprises forming the upper limit value as follows:

$$G_+ = \overline{U}(p) + \Delta;$$

where $\overline{U}$ is the mean value of the measurement variable U and depends on parameter p, and where Δ represents a value of the deviation.

5. The method according to claim 1, where the parameter represents time.

6. The method according to claim 1, where the parameter represents an actuator temperature.

7. The method according to claim 1, which comprises storing a mean value formation of the measurement variable across an entire parameter range, if no individual value of the measurement variable exceeds both limit values and across an entire parameter range.

8. The method according to claim 7, which comprises, after storing the mean value, forming the upper limit value $G_+$ as follows:

$$G_+ = \overline{U}_{ok}(p) + \delta;$$

where $\overline{U}_{ok}$ is the stored mean value of the measurement variable U and depends on parameter p, δ represents a new deviation, and the new deviation δ is smaller than the deviation Δ.

9. The method according to claim 8, which comprises, after storing the mean value, forming the lower limit value $G_-$ as follows:

$$G_- = \overline{U}_{ok}(p) - \delta;$$

where $\overline{U}_{ok}$ is the stored mean value of the measurement variable U and depends on parameter p, δ represents a new deviation, and the new deviation δ is smaller than the deviation Δ.

10. The method according to claim 7, which comprises, after storing the mean value, forming the lower limit value $G_-$ as follows:

$$G_- = \overline{U}_{ok}(p) - \delta;$$

where $\overline{U}_{ok}$ is the stored mean value of the measurement variable U and depends on parameter p, δ represents a new deviation, and the new deviation δ is smaller than the deviation Δ.

11. The method according to claim 1, wherein the given type of actuator is a piezo element, and the measurement variable is an actuator capacitance.

12. The method according to claim 1, wherein the given type of actuator is a magnetic coil, and the measurement variable is an actuator inductance.

13. The method according to claim 1, wherein the measurement variable is an electrical resistance of the actuator.

* * * * *

UNITED STATES PATENT AND TRADEMARK OFFICE

CERTIFICATE OF CORRECTION

PATENT NO. : 7,146,269 B2

APPLICATION NO. : 11/065675
DATED : December 5, 2006
INVENTOR(S) : Arno Friedrich et al.

It is certified that error appears in the above-identified patent and that said Letters Patent is hereby corrected as shown below:

Column 4,

Line 59, “values or is exceeded” should read -- values is exceeded --

Signed and Sealed this

Twentieth Day of February, 2007

JON W. DUDAS
*Director of the United States Patent and Trademark Office*